United States Patent
Chiu et al.

(10) Patent No.: US 8,497,727 B2
(45) Date of Patent: Jul. 30, 2013

(54) DOUBLE POLE DOUBLE THROW SWITCH DEVICE

(75) Inventors: Jui-Chieh Chiu, Taipei (TW); Chih-Wei Chen, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 215 days.

(21) Appl. No.: 13/185,865

(22) Filed: Jul. 19, 2011

(65) Prior Publication Data

US 2012/0139616 A1    Jun. 7, 2012

(30) Foreign Application Priority Data

Dec. 2, 2010    (TW) ................................ 99141861 A

(51) Int. Cl.
*H03K 17/00*    (2006.01)

(52) U.S. Cl.
USPC ............................. 327/365; 327/427; 327/436

(58) Field of Classification Search
USPC ......................................... 327/365, 427, 436
See application file for complete search history.

(56) References Cited

U.S. PATENT DOCUMENTS

| | | | |
|---|---|---|---|
| 7,199,635 B2 * | 4/2007 | Nakatsuka et al. | 327/308 |
| 7,692,472 B2 * | 4/2010 | Fujino | 327/427 |
| 8,093,940 B2 * | 1/2012 | Huang et al. | 327/430 |

* cited by examiner

*Primary Examiner* — Hai L Nguyen
(74) *Attorney, Agent, or Firm* — Winston Hsu; Scott Margo

(57) ABSTRACT

A double pole double throw switch device is provided. The device includes a first path circuit, a second path circuit, a third path circuit and a fourth path circuit. The first terminals of the first and second path circuits are coupled to a first port, and the second terminals of the first and second path circuits are respectively coupled to a third port and a fourth port. The first terminals of the third and fourth path circuits are coupled to a fourth port, and the second terminals of the third and fourth path circuits are respectively coupled to the second port and the third port. Each path circuit includes a switch module and a functional switch circuit. When a switch module is turned on, its corresponding functional switch circuit is turned off, and when the switch module is turned off, its corresponding functional switch circuit is turned on.

8 Claims, 7 Drawing Sheets

DOUBLE POLE DOUBLE THROW SWITCH DEVICE

CROSS REFERENCE TO RELATED APPLICATION

This application claims priority of Taiwan Patent Application No. 099141861, filed on Dec. 2, 2010, the entirety of which is incorporated by reference herein.

BACKGROUND OF THE INVENTION

1. Field of the Invention

The present disclosure relates to a switch device, and in particular relates to a double pole double throw switch device.

2. Description of the Related Art

A conventional double pole double throw switch device 100 is shown in FIG. 1A. The double pole double throw switch device 100 includes four radio frequency path nodes (P1, P2, T1 and T2) and eight switches (TSW1-TSW8). Therefore, there are eight control signals to control the switches TSW1-TSW4 in the series connection path and the switches TSW5-TSW8 in the parallel connection path.

Another conventional double pole double throw switch device 110 is shown in FIG. 1B. The double pole double throw switch device 110 in FIG. 1B is an improvement over that in FIG. 1A. The switches TSW5-TSW8 in the parallel connection path are removed in order to scale the area down and reduce the amount of control signals. However, the isolation capacity of the device is not sufficient.

Thus, a double pole double throw switch device with sufficient isolation capacity and lesser amount of control signals is called for.

BRIEF SUMMARY OF INVENTION

A detailed description is given in the following embodiments with reference to the accompanying drawings.

In one embodiment, the invention provides a double pole double throw switch device with a first, a second, a third, and a fourth port. The double pole double throw switch device includes a first path circuit, a second path circuit, a third path circuit and a fourth path circuit. The first terminals of the first path circuit and the second path circuit are coupled to the first port, and the second terminals of the first path circuit and the second path circuit are respectively coupled to the third port and the fourth port. The first terminals of the third path circuit and the fourth path circuit are coupled to the fourth port, and the second terminals of the third path circuit and the fourth path circuit are respectively coupled to the second port and the third port. Each path circuit includes a switch module and a functional switch circuit. When a switch module is turned on, its corresponding functional switch circuit is turned off, and when the switch module is turned off, its corresponding functional switch circuit is turned on.

In another embodiment, the invention provides a double pole double throw switch device, having a first port, a second port, a third port and a fourth port. The double pole double throw switch device includes a first path circuit and a second path circuit respectively having two terminals, wherein the first terminals of the first path circuit and the second path circuit are coupled to the first port. The second terminal of the first path circuit is coupled to the second port and the second terminal of the second path circuit is coupled to the third port, wherein the first path circuit includes a switch module and a functional switch circuit, and when the switch module is turned on, the functional switch circuit corresponding to the switch module is turned off; and when the switch module is turned off, the functional switch circuit corresponding to the switch module is turned on.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
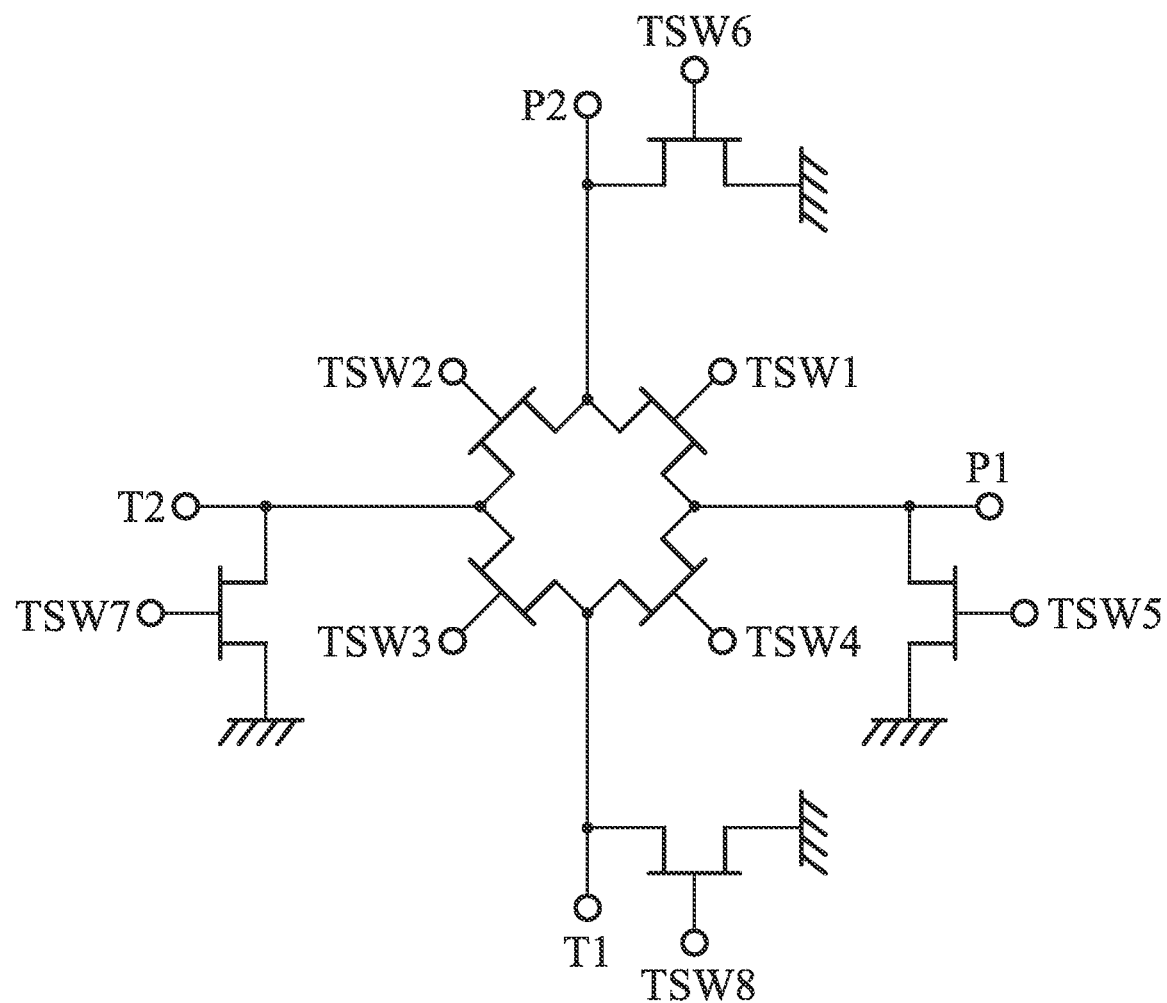
FIG. 1A-1B is a schematic diagram showing a conventional double pole double throw switch device.
Figure 1B:
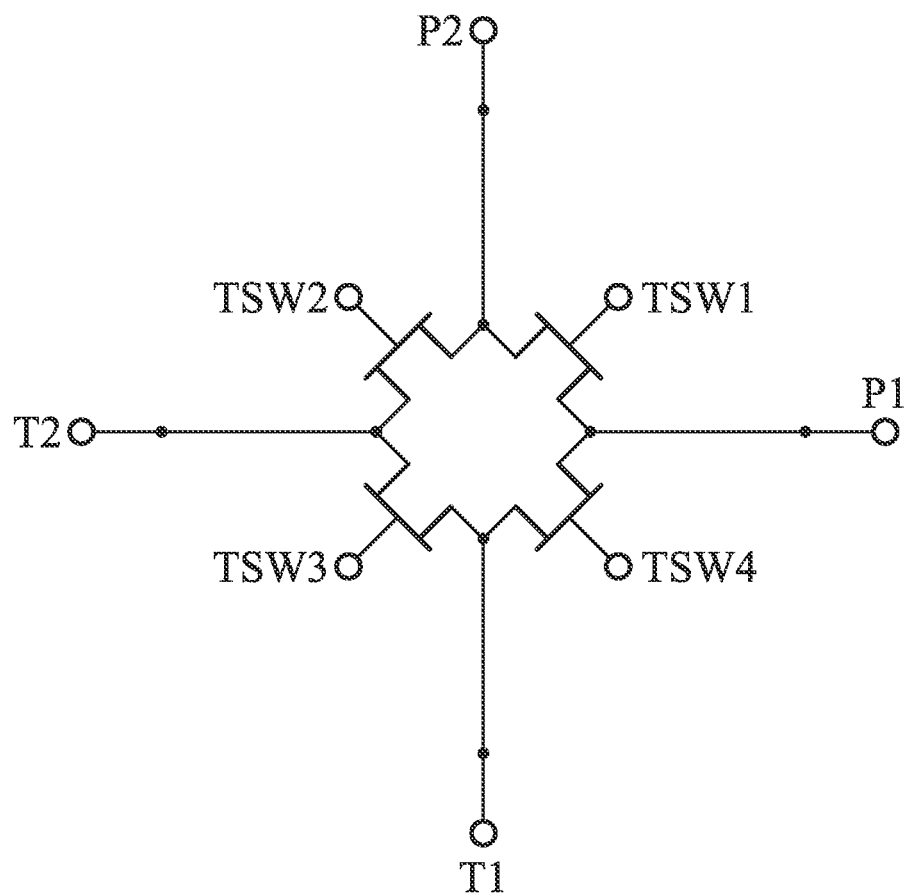
Figure 2:
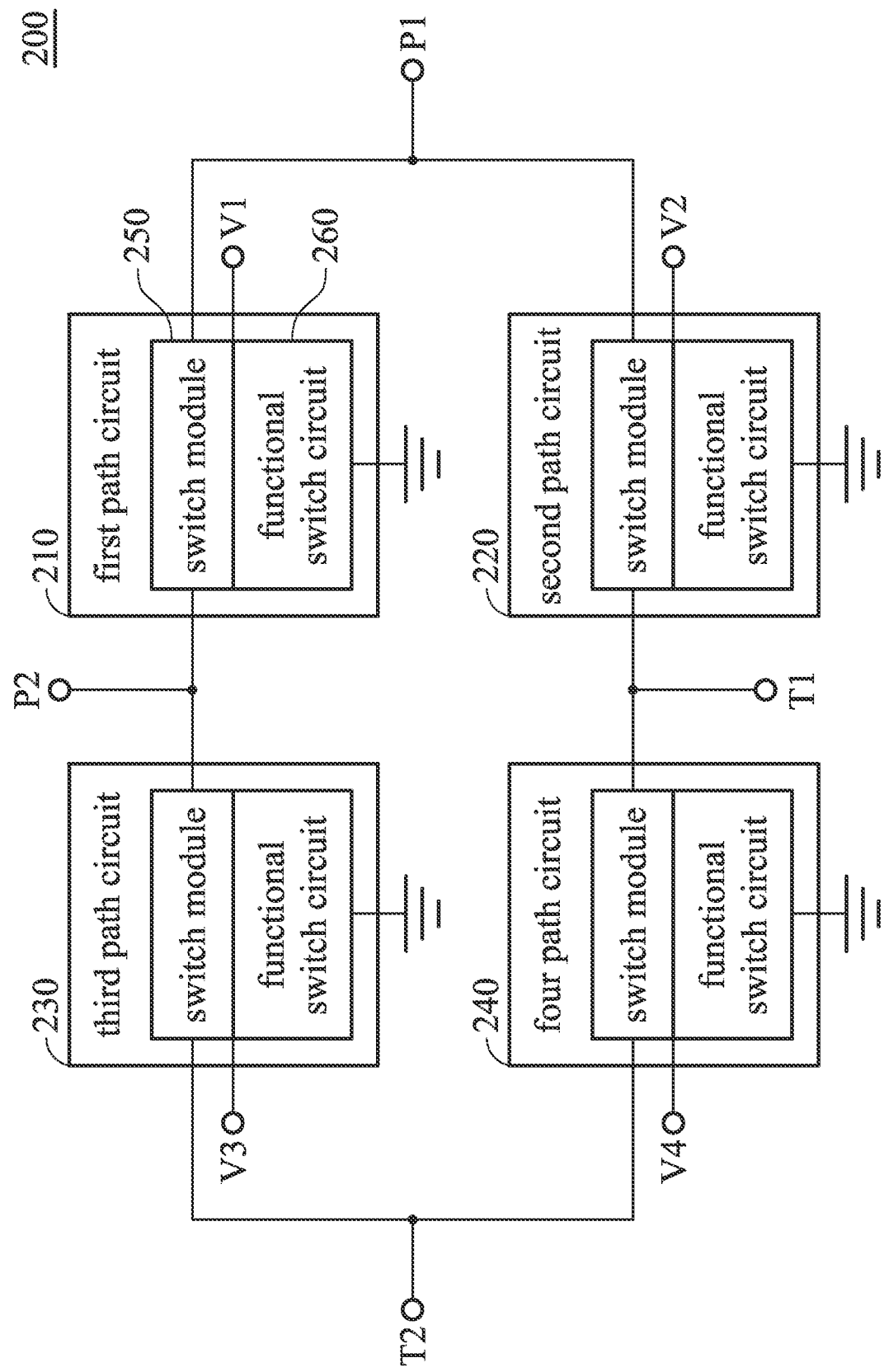
FIG. 2 is a diagram showing a double pole double throw switch device of the invention.

FIG. 2 is a diagram showing a double pole double throw switch device of the invention. The double pole double throw switch device 200 is mainly made up of four path circuits 210-240 and has a first port P1, a second port P2, a third port T1 and a four port T2. For a more detailed description, the double pole double throw switch device 200 includes a first path circuit 210, a second path circuit 220, a third path circuit 230 and a fourth path circuit 240. Each path circuit includes a switch module 250, a functional switch circuit 260 and a respective control signal (V1-V4).

The first path circuit 210 and the second path circuit 220 respectively have two terminals. The first terminals of the first path circuit 210 and the second path circuit 220 are coupled to the first port P1. The second terminals of the first path circuit 210 and the second path circuit 220 are respectively coupled to the second port P2 and the third port T1. The third path circuit 230 and the fourth circuit 240 respectively have two terminals. The first terminals of the third path circuit 230 and the fourth path circuit 240 are coupled to the fourth port T2. The second terminals of the third path circuit 230 and the fourth path circuit 240 are respectively coupled to the second port P2 and the third port T1. The path circuits 210-240 are respectively activated by the control signals V1-V4 such that when a switch module is turned on, a functional switch circuit corresponding to the switch module is turned off, and vice versa.

Each switch module may include a plurality of first switch elements in series. When the double pole double throw switch device 200 is operated at a first frequency band (such as lower frequency), the signal isolation capacity of each path circuit can be raised by adjusting sizes of the first switch elements and amount of the first switches. The functional switch circuit is disposed between a connection node of the two switch elements in the switch module and a ground. Each functional switch circuit may include a second switch element and a capacitor in series. The functional switch circuit is used to raise signal isolation capacity of a path circuit when the double pole double throw switch device 200 is operated at a second frequency band (such as higher frequency). In the embodiment, the frequency of the second frequency band is higher than that of the first frequency band. For example, the second frequency band is above 5.8 GHz, and the first frequency band is below 2.4 GHz. Note that the first switch elements will be all turned on simultaneously or all turned off simultaneously. The control node of the second switch element is coupled to the ground, the first node of the second switch element is coupled to the control signal and the second node of the second switch is coupled to the ground. Furthermore, the second switch operates opposite to the first switch elements according to the control signal.

Figure 3:
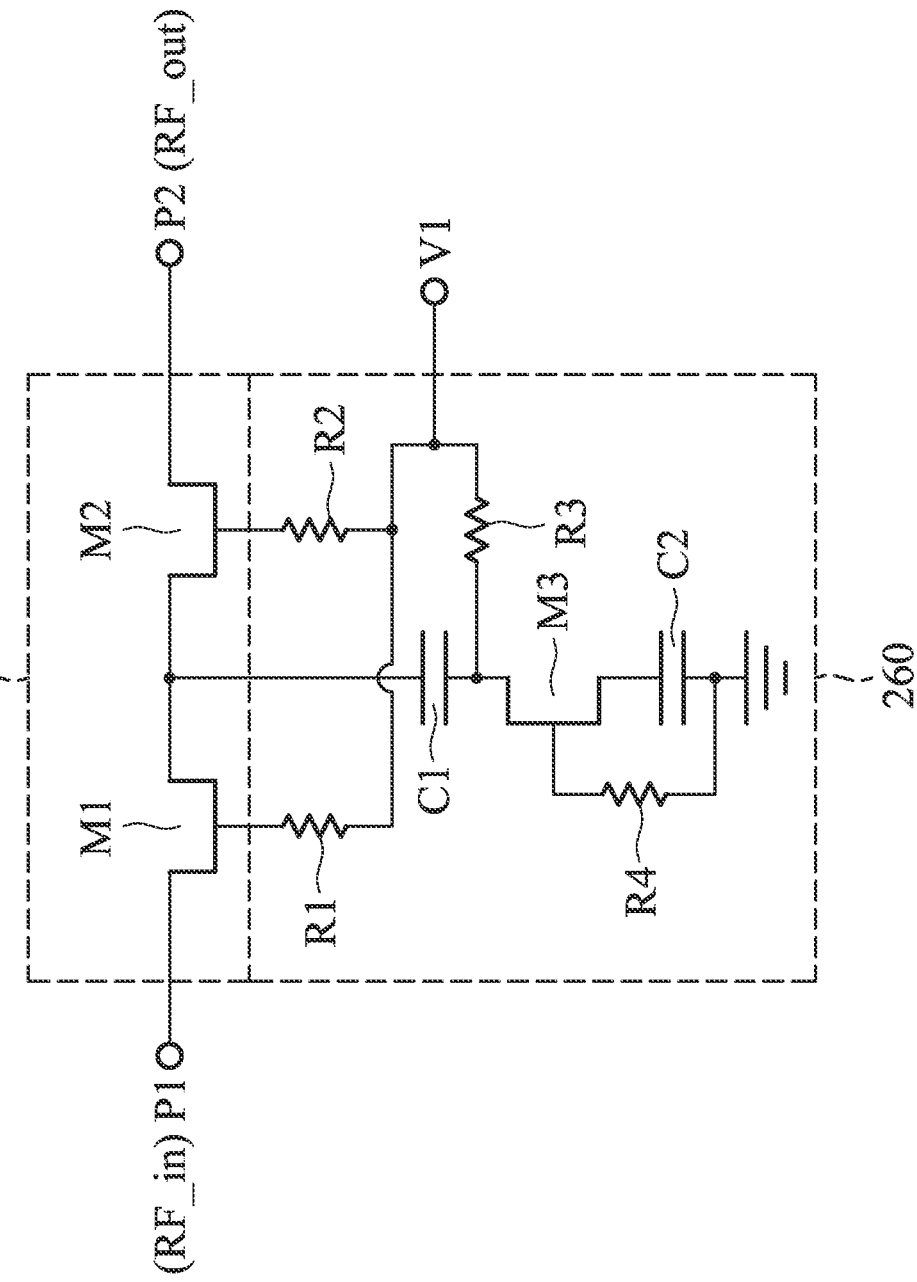
FIG. 3 is schematic diagram showing a path circuit of the double pole double throw switch device of FIG. 2.

FIG. 3 is schematic diagram showing a path circuit of the double pole double throw switch device of FIG. 2. For example, the first path circuit 210 includes a switch module 250 and a functional circuit 260. In the embodiment, the switch module 250 includes two first switch elements M1 and M2 in series. The functional switch circuit 260 includes two first resistors R1 and R2, a second resistor R3, a third resistor R4, a first capacitor C1, a second capacitor C2 and a second switch element M3. The switch elements M1-M3 may be metal oxide semiconductor transistors, but is not limited thereto. The control signal V1 is coupled to the control nodes of the first switch elements M1 and M2 through the first resistors R1 and R2, and coupled to the second switch element M3 though the second resistor R3 to provide the first switch elements M1-M2 and the second switch element M3 with similar voltages. The third resistor R4 is coupled between the control node of the second switch element M3 and the ground. The first capacitor C1 is coupled between the drain/source of the second switch element M3 and a connection node of the first switch elements M1 and M2. The second capacitor C2 is coupled between the drain/source of the second switch element M3 and the ground.

In one embodiment, signals at P1 port (RF_in) will be delivered to P2 port (RF_out) by controlling the first switch elements M1 and M2 in the switch module 250 to be turned on according to the control signal V1, and simultaneously control the second switch element M3 in the functional switch circuit 260 to be turned off.

At a low frequency, when signals at P1 port are not delivered to P2 port, an efficient isolation between P1 port and P2 port can be achieved by controlling the switch elements M1 and M2 to be turned off according to the control signal V1.

At a high frequency, an efficient isolation between P1 port and P2 port can be achieved by controlling the first switch elements M1 and M2 in the switch module 250 to be turned off according to the control signal V1, and simultaneously controlling the second switch element M3 in the functional switch circuit 260 to be turned on. The second switch element M3 and the capacitor C1 and C2 form a conductive path such that if there is a leakage current flowing through the first switch element M1, the leakage current can be led to the ground through the conductive path without escaping to the P2 port through the first switch element M2. Based on this mechanism, the isolation capacity between P1 port and P2 port at high frequencies is efficiently increased.

Figure 4:
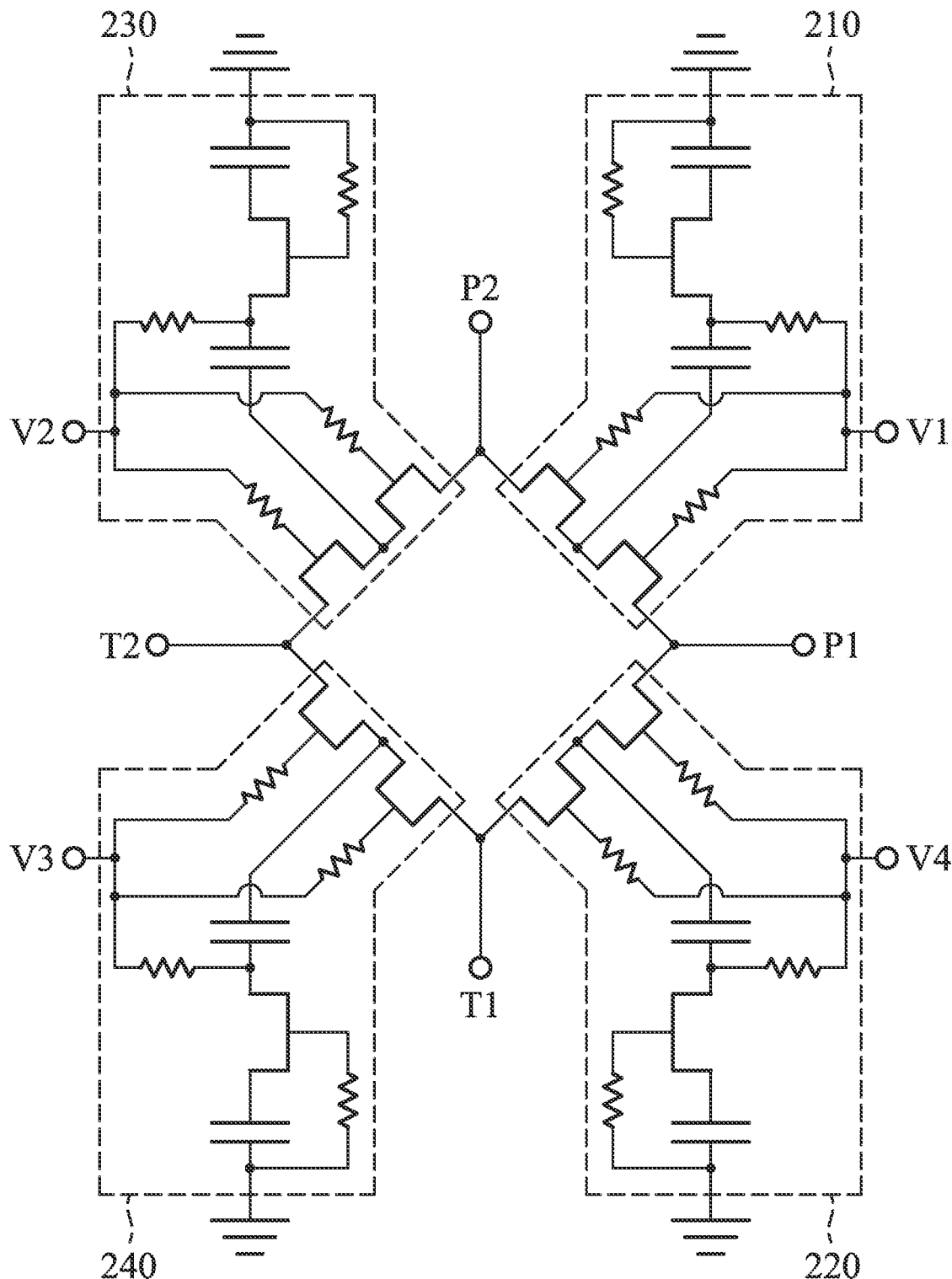
FIG. 4 is a schematic diagram showing the double pole double throw switch device of the invention.

FIG. 4 is a schematic diagram showing the double pole double throw switch device of the invention. In the embodiment, the double pole double throw switch device 200 includes a first path circuit 210 located between the first port P1 and the second port P2, a second path circuit 220 located between the first port P1 and the third port T1, a third path circuit 230 located between the second port P1 and the fourth port T2, and the fourth path circuit 240 located between the third port T1 and the fourth port T2. The path circuits 210-240 respectively have control signals V1-V4. The control signals V1-V4 can determine whether two ports of the four ports are conducted or cut off, and signal isolation capacity between the two ports are at high frequencies or a low frequency.

Figure 5A:
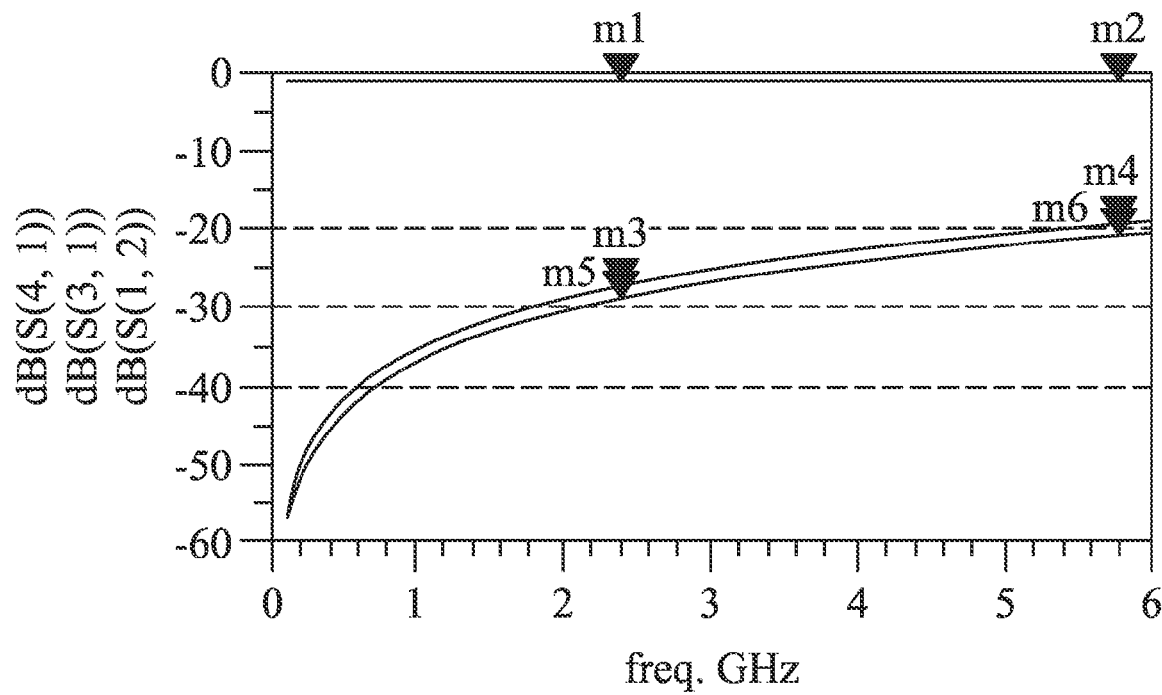
FIG. 5A is a graph showing isolation capacity and frequency of the conventional double pole double throw switch device.
Figure 5B:
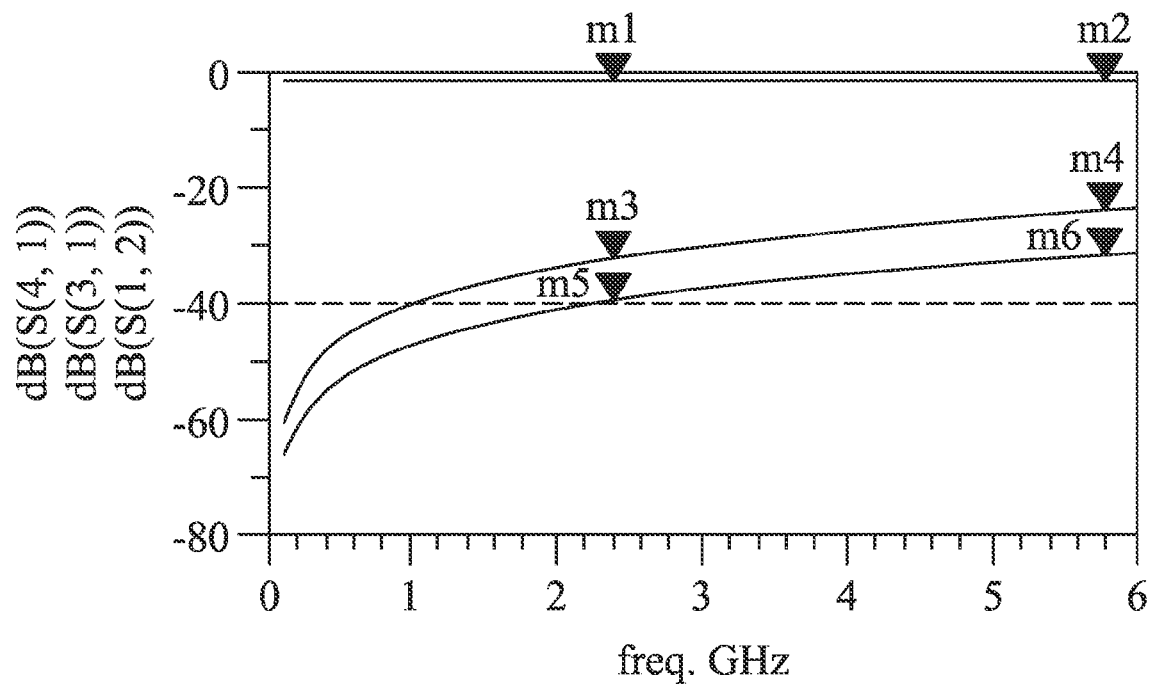
FIG. 5B is a graph showing isolation capacity and frequency of the double pole double throw switch device of the invention.

FIG. 5A is a graph showing isolation capacity and frequency of the conventional double pole double throw switch device. FIG. 5B is a graph showing isolation capacity and frequency of the double pole double throw switch device of the invention. The isolation capacity of the conventional double pole double throw switch device increasingly decays at a high frequency. The signal gain is −60 dB at a low frequency, and the signal gain is −20 dB at high frequencies such as 5.8 GHz. Regarding the double pole double throw switch device of the invention, the signal gain is −31 dB at high frequencies such as 5.8 GHz. Thus, the isolation capacity −31 dB is superior to the conventional double pole double throw switch device at high frequencies.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A double pole double throw switch device, having a first port, a second port, a third port and a fourth port, comprising:
   a first path circuit and a second path circuit, respectively having two terminals, wherein the first terminals of the first path circuit and the second path circuit are coupled to the first port, the second terminal of the first path circuit is coupled to the second port and the second terminal of the second path circuit is coupled to the third port; and
   a third path circuit and a fourth path circuit, respectively having two terminals, wherein the first terminals of the third path circuit and the fourth circuit are coupled to the fourth port, the second terminal of the third path circuit is coupled to the second port and the second terminal of the fourth path circuit is coupled to the third port,
   wherein each path circuit comprises a switch module and a functional switch circuit, and
   wherein when the switch module is turned on, the functional switch circuit corresponding to the switch module is turned off; and when the switch module is turned off, the functional switch circuit corresponding to the switch module is turned on.

2. The double pole double throw switch device as claimed in claim 1, wherein each switch module comprises a plurality of first switch elements in series, and when the double pole double throw switch device is operated at a first frequency band, signal isolation of each path circuit is raised by adjusting sizes of the plurality of first switch elements or amount of the first switch element.

3. The double pole double throw switch device as claimed in claim 2, wherein the functional switch circuit is disposed between a connection node of two switch elements and a ground, and the functional switch used for coupling signals to the ground to raise signal isolation of each path circuit when the double pole double throw switch device is operated at a second frequency band, wherein the frequency range of the second frequency band is higher than that of the first frequency band.

4. The double pole double throw switch device as claimed in claim 3, wherein the plurality of first switch elements are turned on or turned off according to a control signal, and a control node of the second switch element is coupled to the ground, a first node of the second switch element is coupled to the control signal and a second node of the second switch element is coupled to the ground, and the second switch element operates opposite to the first switch element according to the control signal.

5. The double pole double throw switch device as claimed in claim 4, wherein the first switch element and the second switch element are metal oxide semiconductor (MOS) transistors.

6. The double pole double throw switch device as claimed in claim 4, further comprising:
    a first capacitor, coupled between the connection node of two switches in the switch module and the first node of the second switch element; and
    a second capacitor coupled between the second node of the second switch element and the ground.

7. The double pole double throw switch device as claimed in claim 6, wherein the control signal is coupled to the control nodes of the plurality of first switch elements respectively through a plurality of first resistors, and to the first node of the second switch through a second resistor to provide the first switch elements and the second switch element with a similar voltage.

8. The double pole double throw switch device as claimed in claim 7, further comprising a third resistor coupled between the control node of the second switch element and the ground.

\* \* \* \* \*